United States Patent
El Sayed

(10) Patent No.: US 11,635,831 B2
(45) Date of Patent: Apr. 25, 2023

(54) VEHICLE CONTROL PANEL AND PRODUCTION METHOD

(71) Applicant: FAURECIA INTERIEUR INDUSTRIE, Nanterre (FR)

(72) Inventor: Ahamed El Sayed, Chanteloup les Vignes (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 0 days.

(21) Appl. No.: 17/718,234

(22) Filed: Apr. 11, 2022

(65) Prior Publication Data

US 2022/0326792 A1 Oct. 13, 2022

(30) Foreign Application Priority Data

Apr. 9, 2021 (FR) ..................................... 21 03686

(51) Int. Cl.

| G06F 3/041 | (2006.01) |
| B29C 51/08 | (2006.01) |
| B29C 51/14 | (2006.01) |
| B60R 16/02 | (2006.01) |
| B29K 69/00 | (2006.01) |
| B29L 31/30 | (2006.01) |

(52) U.S. Cl.
CPC ............ *G06F 3/041* (2013.01); *B29C 51/082* (2013.01); *B29C 51/14* (2013.01); *B60R 16/02* (2013.01); *B29K 2069/00* (2013.01); *B29K 2995/0005* (2013.01); *B29K 2995/0029* (2013.01); *B29L 2031/30* (2013.01); *G06F 2203/04103* (2013.01)

(58) Field of Classification Search
None
See application file for complete search history.

(56) References Cited

U.S. PATENT DOCUMENTS

2012/0024685 A1    2/2012   Kobayashi

FOREIGN PATENT DOCUMENTS

| CN | 102707848 A | 10/2012 |
| DE | 10329188 A1 | 1/2005 |
| DE | 102004041833 A1 | 3/2006 |
| DE | 102017218243 B3 | 2/2019 |
| DE | 102020118296 A1 | 2/2021 |

(Continued)

OTHER PUBLICATIONS

French Search Report corresponding to French Application No. FR 2103686, dated Nov. 12, 2021, 2 pages.

(Continued)

*Primary Examiner* — Nicholas J Lee
(74) *Attorney, Agent, or Firm* — Reising Ethington P.C.

(57) ABSTRACT

A method of producing a control panel for a vehicle. The method includes the following operations: a) producing a touch-sensitive film, the touch-sensitive film including a film, a conductive layer, a main decorative layer, and a secondary decorative layer, the conductive layer being arranged on an inner face of the film, the main decorative layer being arranged on an outer face of the film, and the secondary decorative layer having at least one critical deformation portion arranged on the inner face of the film in at least one corresponding critical deformation zone; b) shaping said touch-sensitive film, the touch-sensitive film being shaped in a non-developable three-dimensional manner in each critical deformation zone; and c) molding a layer of plastic material onto the main decorative layer.

14 Claims, 4 Drawing Sheets

(56) References Cited

FOREIGN PATENT DOCUMENTS

| | | |
|---|---|---|
| EP | 2395531 A1 | 12/2011 |
| JP | 2016031696 A | 3/2016 |
| TW | M472895 U | 2/2014 |
| WO | 2014021063 A1 | 2/2014 |

OTHER PUBLICATIONS

German Research Report for Application No. 102022108159.1 with Machine Translation, dated Nov. 10, 2022, 11 pages.

VEHICLE CONTROL PANEL AND PRODUCTION METHOD

TECHNICAL FIELD

This disclosure relates to a vehicle control panel and to a method of producing such a control panel. This disclosure relates more particularly to producing a control panel comprising touch-sensitive buttons and having complex shapes while maintaining a high aesthetic level. The control panel is intended to equip various types of vehicles, such as a motor vehicle, a train, a boat, an airplane, or any other vehicle able in particular to travel on land, on water, in water, or in the air.

BACKGROUND

A method is known comprising the following operations:
a) producing a touch-sensitive film, the touch-sensitive film comprising a film, a conductive layer, and a decorative layer, the film having an outer face and an inner face, the conductive layer being arranged on the inner face of the film, the decorative layer being arranged on the outer face of the film,
b) shaping said touch-sensitive film, said film being deformed in a non-developable three-dimensional manner, and
c) molding a layer of plastic material onto the decorative layer, the plastic material allowing the passage of light.

This method is satisfactory. However, for control panels requiring pronounced three-dimensional deformations, it is difficult to avoid damage to the conductive layer and/or decorative layer of the control panel during the shaping and molding operations.

SUMMARY

To remedy the above problems, in accordance with the disclosure, the method comprises the following operations:
a) producing a touch-sensitive film, the touch-sensitive film comprising a film, a conductive layer, a main decorative layer, and a secondary decorative layer, the film having an outer face and an inner face, the conductive layer being arranged on the inner face of the film, the main decorative layer being arranged on the outer face of the film, the secondary decorative layer comprising at least one critical deformation portion arranged on the inner face of the film in at least one critical deformation zone corresponding to the at least one critical deformation portion,
b) shaping said touch-sensitive film, the touch-sensitive film being shaped in a non-developable three-dimensional manner in each critical deformation zone, and
c) molding a layer of plastic material onto the main decorative layer, the plastic material allowing the passage of light.

Thus, the secondary decorative layer makes it possible to mitigate the risk of damage to the main decorative layer and/or to protect the conductive layer.

According to an optional feature in accordance with this disclosure, operation a) comprises the operations of depositing a main decorative material on the outer face of the film to form an opaque portion of the main decorative layer, while leaving in each critical deformation zone a blank portion in which the main decorative material is absent, said opaque portion of the main decorative layer being opaque to light, and depositing a secondary decorative material on the inner face of the film in each critical deformation zone in order to completely cover a portion of the film facing each blank portion and form the at least one critical deformation portion of the secondary decorative layer, the at least one critical deformation portion being opaque to light.

This further reduces the risk of control panels exhibiting cosmetic defects. Indeed, while the film appears to be free from defects after shaping, it has been found that particles of the main decorative layer in the critical deformation zone are detached during the molding of the layer of plastic material. The particles lifted by the plastic material could create aesthetic defects, decorative material being absent from the outer surface of the film within the critical deformation zone. The risk of weakening the main decorative layer during shaping and of lifting off particles of opaque material during the molding of the layer of plastic material is reduced.

According to an additional optional feature, the main decorative layer is devoid of any material in the blank portion.

According to another additional feature in accordance with this disclosure, each critical deformation portion of the secondary decorative layer preferably has a covering portion extending along the entire periphery of the critical deformation portion and overlapping the main decorative layer.

The risk of seeing through the touch-sensitive film, between the main decorative layer and the secondary decorative layer, is thus reduced.

According to another additional optional feature, each covering portion has preferably a width of less than 5 millimeters.

According to another additional optional feature, each covering portion has preferably a width of less than 1 millimeter.

Since the secondary decorative layer does not have infinite resistivity, as the secondary decorative layer is in contact with or is very close to the conductive layer, in order to reduce the effect of the secondary decorative layer which could degrade touch detection, it is preferable to reduce the surface area of the secondary decorative layer as much as possible.

According to another optional feature, operation a) comprises depositing a translucent portion of the main decorative layer on the outer face of the film, the translucent portion allowing at least some of the light to pass through, being arranged at a distance from each blank portion and surrounded by the opaque portion.

A pictogram is thus produced, which may be backlit, allowing the user to know what the touch-sensitive buttons correspond to. The presence of a light source to illuminate the pictogram could make visible the presence of particles of the main decorative layer in the plastic material, which increases the importance of avoiding this presence.

According to an additional feature, the translucent portion preferably allows between 5 and 30% of the light to pass through.

According to an additional feature, the translucent portion preferably allows between 10% and 20% of the light to pass through.

Thus, when it is not backlit, the pictogram is not visible.

According to another additional feature, a light source is preferably arranged in line with the translucent portion.

According to yet another additional feature, the blank portion of the decorative layer allows at least 50% of the light to pass through.

According to another feature in accordance with this disclosure, each critical deformation portion preferably has an area of less than 1 square centimeter, preferably less than 10 square millimeters.

The detrimental effect of the presence of the secondary decorative layer for the detection of a command on a touch sensor is thus reduced.

According to another feature in accordance with this disclosure, the production of the conductive layer during operation a) preferably comprises the deposition of a highly deformable material on the inner face of the film in each critical deformation zone, and the deposition of a highly conductive material on the inner face of the film away from each critical deformation zone, the highly deformable material being more transparent to light than the highly conductive material and the highly conductive material having a lower resistivity than the highly deformable material.

This prevents the conductive layer from being visible in the critical deformation zone while encouraging the electrical conduction of the conductive layer outside the critical deformation zone.

According to yet another additional optional feature in accordance with this disclosure, the highly deformable material is permeable to at least 50% of the light, preferably at least 90% of the light. The highly conductive material is permeable to less than 50% of the light, preferably less than 10% of the light.

According to another feature in accordance with this disclosure, operation b) comprises shaping the touch-sensitive film on a forming die, the forming die facing the outer face of the film and the secondary decorative layer being shaped into a concave shape at each critical deformation portion.

Thus, neither the secondary decorative layer nor the conductive layer comes into contact with the forming die during operation b), which reduces the risk of damage.

In various embodiments according to this disclosure, use may optionally be made of one or more of the following provisions:
- during operation a), the secondary decorative layer is created in the same color as the main decorative layer;
- the secondary decorative material is identical to the main decorative material;
- operation a) comprises depositing the secondary decorative layer on the conductive layer, the conductive layer being interposed between the film and the secondary decorative layer.

This disclosure further relates to a control panel for a vehicle, comprising:
- a touch-sensitive film, the touch-sensitive film comprising a film, a conductive layer, and a main decorative layer, the film having an outer face and an inner face, the conductive layer being arranged on the inner face of the film, the main decorative layer being arranged on the outer face of the film, the touch-sensitive film having a non-developable three-dimensional shape in at least one critical deformation zone, and
- a plastic layer molded onto the main decorative layer, the plastic layer allowing the passage of light,
- wherein the touch-sensitive film further comprises a secondary decorative layer, the secondary decorative layer comprising at least one critical deformation portion arranged on the inner face of the film in each critical deformation zone.

Thus, a control panel having a shape requiring high stretching of the film while being robust, reliable, and aesthetically satisfactory can be obtained.

According to an optional feature in accordance with this disclosure, the main decorative layer comprises an opaque portion and at least one blank portion, said opaque portion of the main decorative layer is of a main decorative material, opaque to light, the at least one blank portion is present in each critical deformation zone, said main decorative material is absent in each blank portion, and the at least one critical deformation portion of the secondary decorative layer extends entirely opposite each blank portion and is of the main decorative material, opaque to light.

BRIEF DESCRIPTION OF THE DRAWINGS

Other features and advantages of this disclosure will become apparent from the following detailed description, with reference to the accompanying drawings in which.

DETAILED DESCRIPTION

Figure 1:
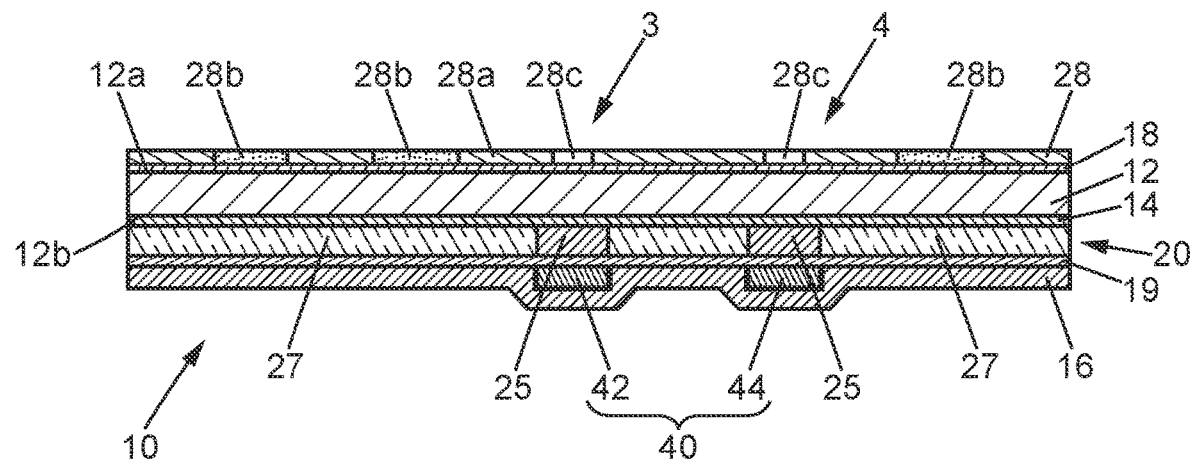
FIG. 1 shows a touch-sensitive film obtained in a first operation of a method for producing a control panel in accordance with this disclosure.

FIG. 1 illustrates a touch-sensitive film 10 essentially comprising a film 12, a conductive layer 20, a main decorative layer 28, and a secondary decorative layer 40. The conductive layer 20, the main decorative layer 28, and the secondary decorative layer 40 are carried by the film 12. The film 12 has an outer face 12a and an inner face 12b. In the illustrated embodiment, the main decorative layer 28 is arranged on the outer face 12a of the film 12, the conductive layer 20 and the secondary decorative layer 40 are arranged on the inner face 12b of the film 12. The film 12 extends between the main decorative layer 28 on the one hand and the conductive layer 20 and secondary decorative layer 40 on the other hand.

The film 12 is transparent and preferably flexible. The film 12 is made of a thermoplastic material, preferably polycarbonate.

Figure 7:
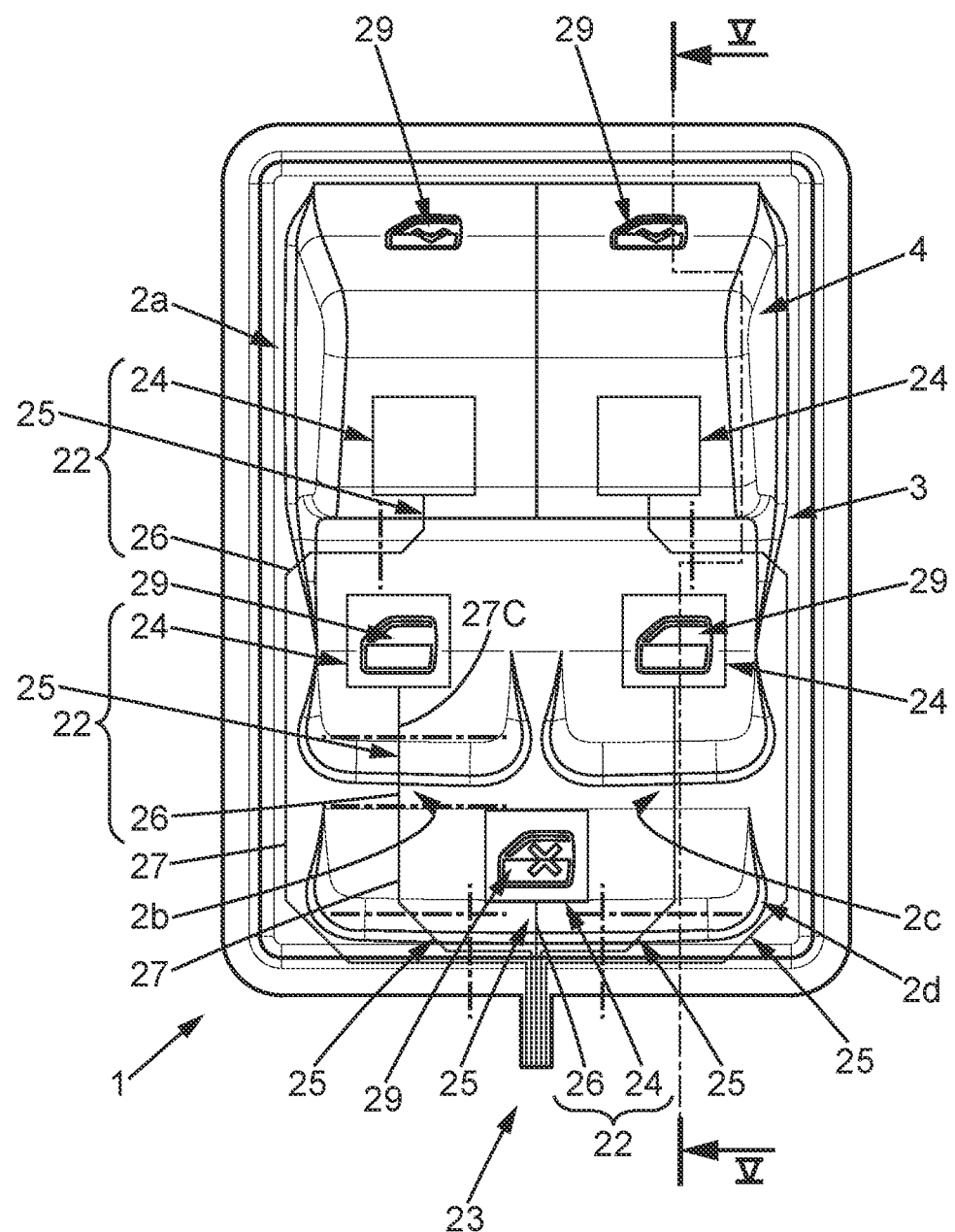
FIG. 7 schematically represents a top view of the control panel of FIG. 6.

In the illustrated embodiment, the conductive layer 20 defines five active portions 22 each comprising a touch sensor 24 and an electrically conductive track 26, as illustrated in FIG. 7. Each electrically conductive track 26 extends between the corresponding touch sensor 24 and a connection zone 23.

In the illustrated embodiment, the touch-sensitive film 10 comprises a single film 12. Alternatively, the touch-sensitive film 10 could comprise several films 12, preferably two or three films 12, the films 12 being superimposed, and the active portions 22 would then be distributed over the different films 12.

The electrically conductive tracks 26 have portions of highly deformable material 25 and portions of highly conductive material 27 in succession. The position of the portions of highly deformable material and of the portions of highly conductive material is established according to subsequent operations as will be explained below.

Preferably, the highly deformable material 25 comprises carbon nanotubes and fullerenes, while the highly conductive material 27 is preferably made of silver, copper, zinc, or an alloy of these metals. The highly deformable material 25 is substantially transparent to light (light transmission of at least 95%), while the highly conductive material 27 is opaque (light transmission of less than 1%).

The conductive layer 20 may in particular be formed by depositing the highly deformable material 25 and the highly conductive material 27 on the film 12. Then, each of the active portions 22 is produced by removing material, by means of a laser or the like, around the active portions 22. Preferably, the film 12 is arranged to be flat for the deposition of the highly deformable material 25 and highly conductive material 27 on the film 12.

The portion of the conductive layer 20 which does not belong to any of the active portions 22 preferably constitutes the (electrical) ground. The portion of the conductive layer 20 forming the ground is connected to the connection zone 23.

Each of the touch sensors 24 is considerably more massive than each of the electrically conductive tracks 26, of small width, so that the presence of an element such as a finger next to the touch sensors 24 is detectable by resistive or capacitive measurement at the connection zone 23 between the active portion 22 and the ground, while the presence of the element next to the electrically conductive tracks 26 has little influence.

The main decorative layer 28 comprises an opaque portion 28a and an optional translucent portion 28b. The opaque portion 28a is made of a main decorative material, preferably in the form of ink. The opaque portion 28a defines a pictogram 29. In the illustrated embodiment, the translucent portion 28b extends into the portion constituting the pictogram 29. Preferably, the translucent material forming the translucent portion 28b is not perfectly transparent and is slightly colored in the same shade as the main decorative material, so that the pictogram 29 is apparent only in the presence of a light source activated under the touch-sensitive film 10, as will be explained below. The opaque portion 28a and the translucent portion 28b are preferably produced by depositing ink on the film 12.

The main decorative layer 28 further comprises blank portions 28c arranged in critical deformation zones 3, 4. In the blank portions 28c, the main decorative layer 28 is devoid of the main decorative material, translucent material, and more generally of any material. Two blank portions 28c are visible in FIGS. 1 to 5.

The secondary decorative layer 40 comprises critical deformation portions 42, 44 in the critical deformation zones 3, 4. The critical deformation portions 42, 44 are made of a secondary decorative material, preferably in the form of ink. Preferably, the secondary decorative material is identical to the main decorative material. Two critical deformation portions 42, 44 are visible in FIGS. 1 to 5. The critical deformation portions 42, 44 are arranged under the conductive layer 20. In other words, the conductive layer 20 extends between the film 12 and the critical deformation portions 42, 44.

In the illustrated embodiment, the touch-sensitive film 10 further comprises a first adhesion layer 14, a second adhesion layer 18, a third adhesion layer 19, and a protective layer 16. The first adhesion layer 14 extends between the film 12 and the conductive layer 20 and is intended to promote the adhesion of the conductive layer 20 on the film 12. The second adhesion layer 18 extends between the film 12 and the main decorative layer 28 and is intended to promote the adhesion of the main decorative material constituting the main decorative layer 28 on the film 12. The third adhesion layer 19 extends between the conductive layer 20 and the secondary decorative layer 40 and is intended to promote the adhesion of the secondary decorative material constituting the secondary decorative layer 40 on the conductive layer 20. The protective layer 16 covers the conductive layer 20 and the secondary decorative layer 40 which it protects. The protective layer 16 may in particular consist of a varnish to act as electrical insulation and/or to protect against humidity and chemical agents (for example, cleaning products). For better readability, the representation of the first adhesion layer 14, the second adhesion layer 18, and the protective layer 16 has been omitted in FIGS. 2 to 5.

The conductive layer 20 is preferably arranged on the inner face 12b of the film 12, more specifically on the first adhesion layer 14. The highly deformable material 25 is deposited on the inner face 12b of the film 12, in particular in each critical deformation zone 3, 4. The highly conductive material 27 is deposited on the inner face 12b of the film 12, away from each critical deformation zone 3, 4.

Then, after the second adhesion layer 18 is deposited on the outer face 12a of the film 12, the main decorative material and the translucent material are deposited on the outer face 12a of the film 12, more precisely on the second adhesion layer 18, respectively to form the opaque portion 28a and the translucent portion 28b of the main decorative layer 28, leaving the blank portions 28c devoid of any material in each critical deformation zone 3, 4.

In addition, the secondary decorative material is deposited on the inner face 12b of the film 12, more precisely on the third adhesion layer 19, in each critical deformation zone 3, 4 in order to completely cover each blank portion 28c and form the critical deformation portions 42, 44 of the secondary decorative layer 40. The secondary decorative material and therefore the critical deformation portions 42, 44 are opaque to light.

Figure 2:
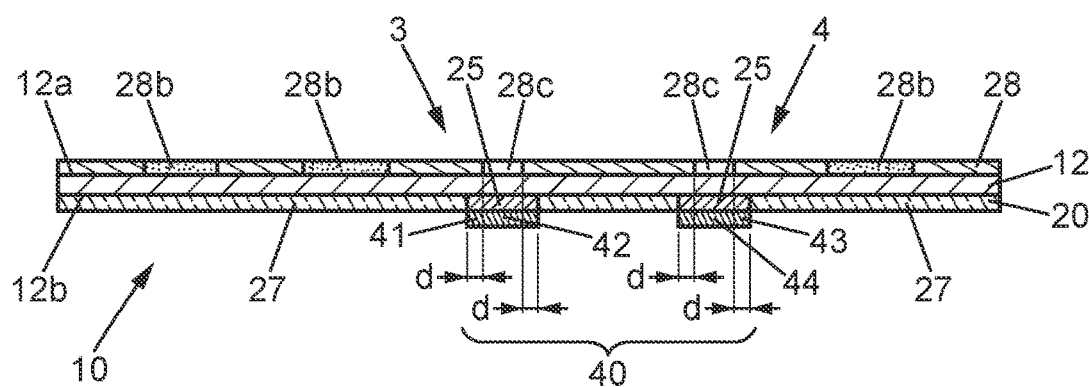
FIG. 2 schematically represents the touch-sensitive film of FIG. 1.

As illustrated in particular in FIG. 2, each critical deformation portion 42, 44 has a covering portion 41, 43 extending along the entire periphery of the critical deformation portion 42, 44 and overlapping the main decorative layer 28. The covering portion 41, 43 has a width d that is preferably less than 1 millimeter.

Each critical deformation portion 42, 44 has an area of less than 1 square centimeter, preferably less than 10 square millimeters.

Preferably, the translucent material allows between 10 and 20% of the light to pass through, while the main decorative material and the secondary decorative material allow less than 1% of the light to pass through.

Figure 3:
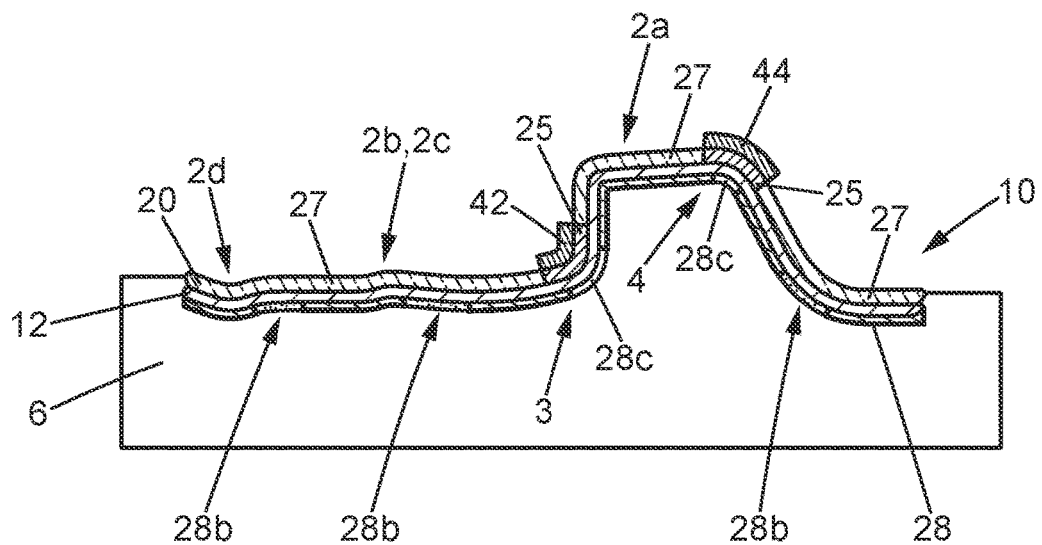
FIG. 3 shows a second step of the method.

As illustrated in FIG. 3, after creating the touch-sensitive film 10 during a first process step, the touch-sensitive film 10 is shaped during a second process step.

Figure 6:
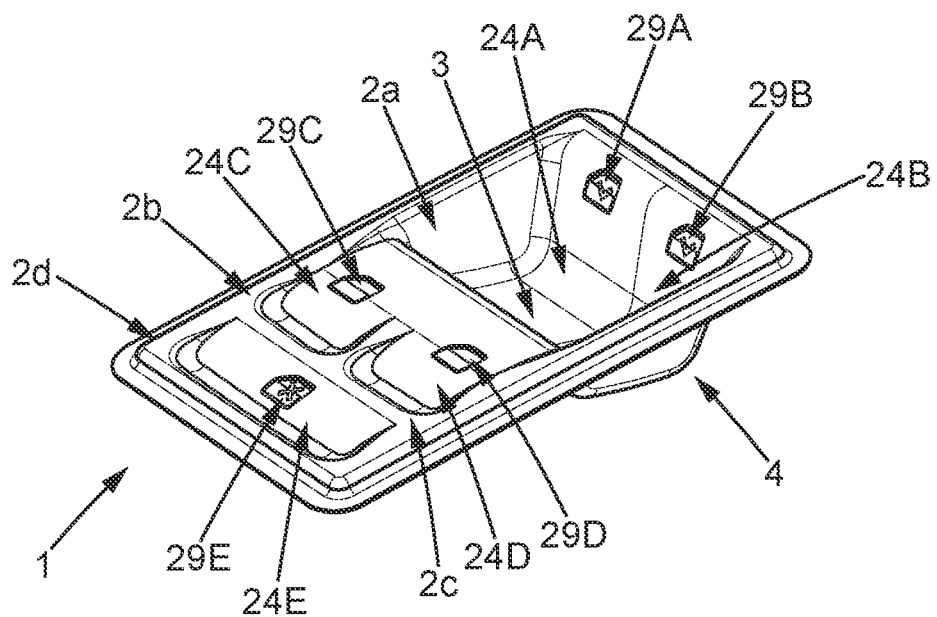
FIG. 6 shows the control panel in a perspective view.

The touch-sensitive film 10 is heated and then shaped on a forming die 6. The touch-sensitive film 10 undergoes three-dimensional shaping by suction against the forming die 6 which causes material to stretch, particularly in deformation zones 2a, 2b, 2c, 2d. As can be seen in FIGS. 3, 6, and 7, in the deformation zones 2a, 2b, 2c, 2d the touch-sensitive film 10 cannot be flattened back down by the weight of its material after the forming operation. The first critical deformation zone 3 and the second critical deformation zone 4 are sub-portions of deformation zone 2a. As can be seen in particular in FIG. 3, the film 12 is subjected to suction pressure and bears against the forming die 6. At the first critical deformation zone 3 and second critical deformation zone 4, in other words at the blank portions 28c, the film 10 is the most stressed.

The active portions 22 of the conductive layer 20 are preferably arranged so as to reduce their deformation during the three-dimensional shaping of the touch-sensitive film 10. But, due to the desired shape of the touch-sensitive film, one cannot avoid stretching the electrically conductive tracks 26 during the three-dimensional shaping of the touch-sensitive film 10. Thus, each of the electrically conductive tracks 26 has at least one portion of strong deformation 25. The electrically conductive tracks 26 are able to undergo an elongation of 100% while remaining conductive for their entire length, in other words from the connection zone 23 to the corresponding touch sensor 24.

The electrically conductive tracks 26 have been created with portions of highly deformable material in the portions of high deformation 25 and portions of highly conductive material 27 for the rest. In FIG. 7, the alternation between portions of highly deformable material 25 and portions of highly conductive material 27 is schematically represented by a line of dots and dashes (also sometimes called a phantom line) extending across the electrically conductive tracks 26.

Figure 4:
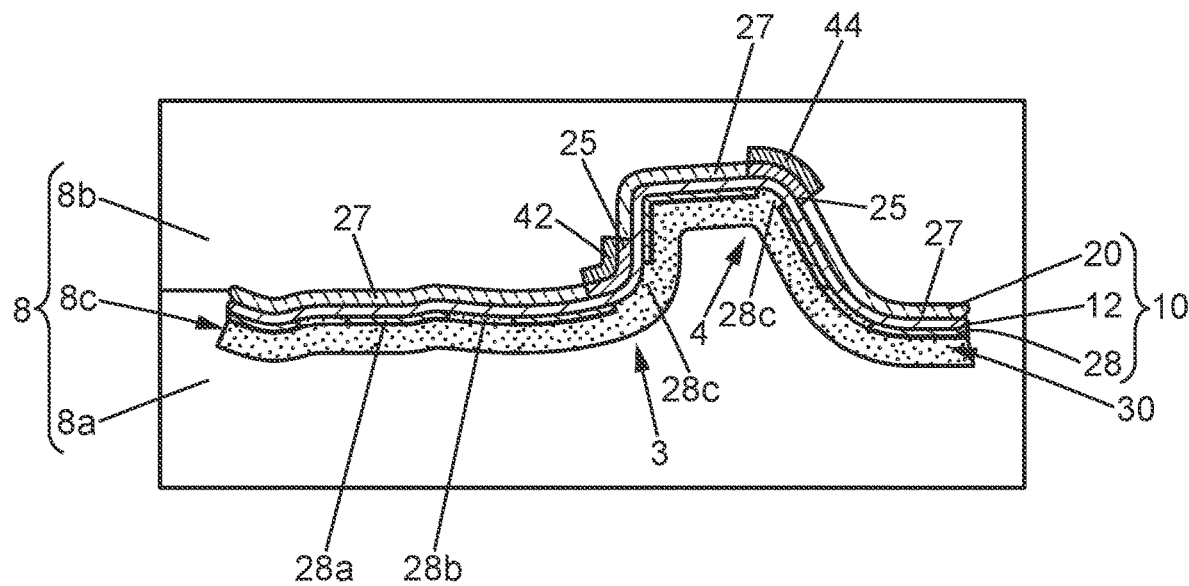
FIG. 4 shows a third step of the method.

As illustrated in FIG. 4, the touch-sensitive film 10 is then arranged in a cavity 8c extending between a first part 8a and a second part 8b of a mold 8. A thermoplastic material is then introduced into the cavity 8c, preferably by injection, in order to over-mold the touch-sensitive film 10. The thermoplastic material more precisely comes into contact with the main decorative layer 28 in the embodiment illustrated in FIG. 4, to form a layer of plastic material 30. The layer of plastic material 30 is preferably smoked polycarbonate.

The layer of plastic material 30 protects and maintains the touch-sensitive film 10 in the desired shape, the layer of plastic material 30 being rigid.

Figure 5:
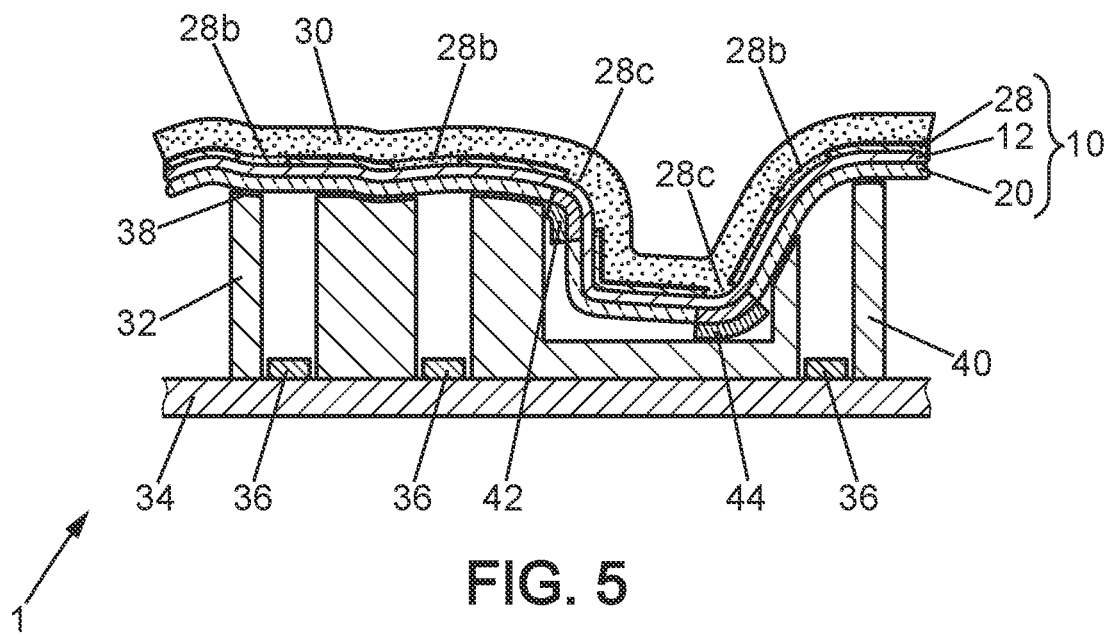
FIG. 5 shows the control panel obtained by the method according to this disclosure, in a section view along the line denoted V-V in FIG. 7.

As illustrated in FIG. 5, a rigid support 32 is then fixed on the touch-sensitive film 10 and the layer of plastic material 30. The rigid support 32 is arranged on the side of the conductive layer 20 relative to the film 12, which is the side opposite to the layer of plastic material 30. In the illustrated embodiment, the rigid support 32 is maintained relative to the touch-sensitive film 10 by means of an adhesive 38 interposed between the rigid support 32 and the touch-sensitive film 10. The adhesive 38 is made of material that is well known per se and is in the form of a liquid, a gel, or a flexible strip (double-sided). The rigid support 32 has separated through-cavities 40. Light sources 36 carried by a printed circuit board 34 are arranged at one end of the cavities 40, the touch-sensitive film 10 being arranged at the opposite end of the cavities 40. The cavities 40 are separated from each other by the rigid support 32 which is opaque or made opaque between the cavities 40. Each of the translucent portions 28b, or at least each of the pictograms 29, is arranged in line with the light sources 36 in order to allow light to pass through the pictograms 29.

FIGS. 5 to 7 illustrate the control panel 1 produced. The control panel 1 is intended to be arranged in a vehicle. In the illustrated embodiment, the control panel 1 is intended to be fixed to a door panel. However, alternatively, it could be arranged on the dashboard, on the center console, between the front seats, on the headliner, on the side panels of the luggage compartment, or in some other suitable location of the vehicle.

The invention claimed is:

1. Method of producing a control panel for a vehicle, comprising the following operations:

a) producing a touch-sensitive film, the touch-sensitive film comprising a film, a conductive layer, a main decorative layer, and a secondary decorative layer, the film having an outer face and an inner face, the conductive layer being arranged on the inner face of the film, the main decorative layer being arranged on the outer face of the film, the secondary decorative layer comprising at least one critical deformation portion arranged on the inner face of the film in at least one critical deformation zone corresponding to the at least one critical deformation portion, b) shaping said touch-sensitive film, the touch-sensitive film being shaped in a non-developable three-dimensional manner in each critical deformation zone, and c) molding a layer of plastic material onto the main decorative layer, the plastic material allowing the passage of light.

2. Method according to claim 1, wherein operation a) comprises the following operations:

depositing a main decorative material on the outer face of the film to form an opaque portion of the main decorative layer, while leaving in each critical deformation zone a blank portion in which the main decorative material is absent, said opaque portion of the main decorative layer being opaque to light, and depositing a secondary decorative material on the inner face of the film in each critical deformation zone in order to completely cover a portion of the film facing each blank portion and form the at least one critical deformation portion of the secondary decorative layer, the at least one critical deformation portion being opaque to light.

3. Method according to claim 2, wherein each critical deformation portion of the secondary decorative layer has a covering portion extending along the entire periphery of the critical deformation portion and overlapping the main decorative layer.

4. Method according to claim 3, wherein each covering portion has a width of less than 5 millimeters.

5. Method according to claim 3, wherein each covering portion has a width of less than 1 millimeter.

6. Method according to claim 2, wherein operation a) comprises depositing a translucent portion of the main decorative layer on the outer face of the film, the translucent portion being configured to allow at least some of the light to pass through, being arranged at a distance from each blank portion and surrounded by the opaque portion.

7. Method according to claim 6, wherein the translucent portion allows between 5 and 30% of the light to pass through.

8. Method according to claim 6, wherein the translucent portion allows between 10% and 20% of the light to pass through.

9. Method according to claim 1, wherein each critical deformation portion has an area of less than 1 square centimeter.

10. Method according to claim 1, wherein each critical deformation portion has an area of less than 10 square millimeters.

11. Method according to claim 1, wherein the production of the conductive layer during operation a) comprises:

depositing a highly deformable material on the inner face of the film in each critical deformation zone, and depositing a highly conductive material on the inner face of the film away from each critical deformation zone, the highly deformable material being more transparent to light than the highly conductive material and the highly conductive material having a lower resistivity than the highly deformable material.

12. Method according to claim 1, wherein operation b) comprises shaping the touch-sensitive film on a forming die, the forming die facing the outer face of the film and the secondary decorative layer being shaped into a concave shape at each critical deformation portion.

13. Control panel for a vehicle, comprising:
a touch-sensitive film, the touch-sensitive film comprising a film, a conductive layer, and a main decorative layer, the film having an outer face and an inner face, the conductive layer being arranged on the inner face of the film, the main decorative layer being arranged on the outer face of the film, the touch-sensitive film having a non-developable three-dimensional shape in at least one critical deformation zone, and
a plastic layer molded onto the main decorative layer, the plastic layer allowing the passage of light,
wherein the touch-sensitive film further comprises a secondary decorative layer, the secondary decorative layer comprising at least one critical deformation portion arranged on the inner face of the film in each critical deformation zone.

14. Control panel according to claim 13, wherein the main decorative layer comprises an opaque portion and at least one blank portion, said opaque portion of the main decorative layer is of a main decorative material, opaque to light, the at least one blank portion is present in each critical deformation zone, said main decorative material is absent in each blank portion, and the at least one critical deformation portion of the secondary decorative layer extends entirely opposite each blank portion and is of the main decorative material, opaque to light.

* * * * *